United States Patent
Miyaharu (10) Patent No.: US 8,253,931 B2
(45) Date of Patent: Aug. 28, 2012

(54) EXPOSURE APPARATUS AND DEVICE MANUFACTURING METHOD

(75) Inventor: Takafumi Miyaharu, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 311 days.

(21) Appl. No.: 12/607,774

(22) Filed: Oct. 28, 2009

(65) Prior Publication Data

US 2010/0112469 A1      May 6, 2010

(30) Foreign Application Priority Data

Oct. 30, 2008      (JP) ................... 2008-280268

(51) Int. Cl.
*G01B 9/00*      (2006.01)
(52) U.S. Cl. ..................... 356/124; 356/124.5
(58) Field of Classification Search ....... 356/124–124.5, 356/399–401, 614–623; 355/67, 72, 75
See application file for complete search history.

(56) References Cited

U.S. PATENT DOCUMENTS 7,315,353 B2      1/2008   Van De Kerkhof et al.
7,586,626 B2 *    9/2009   Yamazoe ...................... 356/620

FOREIGN PATENT DOCUMENTS

JP       2006-108689 A      4/2006

* cited by examiner

*Primary Examiner* — Tri T Ton
(74) *Attorney, Agent, or Firm* — Canon U.S.A., Inc. IP Division (57) ABSTRACT

An apparatus includes an optical system for illuminating an original, a measurement device which includes an image sensor arranged on a substrate stage, and is configured to measure a characteristic of the optical system based on a light intensity distribution that is formed on an image sensing plane of the image sensor via the optical system and a measurement pattern, a calibration pattern arranged to form a light intensity distribution having a known shape on the image sensing plane, and a controller configured to calibrate the measurement device based on the light intensity distribution by the calibration pattern, and a theoretical light intensity distribution that is expected to be formed on the image sensing plane by the calibration pattern, wherein the calibration pattern is arranged around a region where the measurement pattern is arranged.

17 Claims, 10 Drawing Sheets

EXPOSURE APPARATUS AND DEVICE MANUFACTURING METHOD

BACKGROUND OF THE INVENTION

1. Field of the Invention

The present invention relates to an exposure apparatus including an optical system for illuminating an original to project the pattern of the original onto a substrate and a method of manufacturing a device using the exposure apparatus.

2. Description of the Related Art

An exposure apparatus is employed in a process of manufacturing a semiconductor device or a display device using photolithography. The exposure apparatus projects a pattern formed on an original (also called a reticle or a mask) onto a substrate (e.g., a wafer or a glass plate) by a projection optical system to expose the substrate. The substrate is coated with a photosensitive agent (resist). The pattern of the original is transferred onto the photosensitive agent as a latent image. A physical pattern (resist pattern) is formed on the substrate by developing the photosensitive agent.

A minimum feature size (resolution) that the exposure apparatus can form is proportional to the wavelength of the exposure light and is inversely proportional to the numerical aperture (NA) of the projection optical system. According to this principle, the shorter the wavelength of the exposure light, and the higher the NA, the better the resolution. To keep up with the recent demand for advances in micropatterning of semiconductor devices, it is demanded to further improve the resolution.

To shorten the exposure wavelength, a light source of an exposure apparatus has changed from a KrF excimer laser (wavelength: about 248 nm) to an ArF excimer laser (wavelength: about 193 nm). At present, an $F_2$ laser (wavelength: about 157 nm) and an EUV (Extreme UltraViolet) light source are under development, aiming at their practical application as the next-generation light sources.

Under the circumstances, immersion exposure is attracting attention as a method of further improving the resolution while utilizing an ArF excimer laser or an $F_2$ laser as a light source. The immersion exposure is a technique of further increasing the NA of a projection optical system by using a liquid as the medium of the projection optical system on the substrate side (on the image plane side). That is, the immersion exposure employs the fact that the NA of the projection optical system is given by $NA = n \cdot \sin \theta$, where n is the refractive index of the medium. Accordingly, the NA of the projection optical system can be increased to n by filling the space between the projection optical system and the substrate with a medium (liquid) having a refractive index (n>1) higher than that of air. In other words, the immersion exposure is a technique of improving the resolution by increasing the NA of the projection optical system on the substrate side.

An exposure apparatus includes a plurality of photosensors which receive exposure light. Based on the outputs from these photosensors, the exposure apparatus performs various types of mechanical adjustment and optical adjustment, and determines various kinds of operation conditions, thereby optimizing substrate exposure. Using photosensors, an exposure apparatus can measure, for example, the σ value (effective light source distribution) of an illumination optical system and the pupil transmittance distribution of a projection optical system (Japanese Patent Laid-Open No. 2006-108689).

Precise imaging simulation can be performed by combining the measured σ value of the illumination optical system and the pupil transmittance distribution of the projection optical system with data on, e.g., a wavefront aberration measurement device for the projection optical system. This makes it possible to optimize the exposure condition of an exposure apparatus including an illumination optical system and a projection system.

By virtue of the recent technical advances of exposure apparatuses, a resolution of several tens of nanometers has become achievable. As the resolution improves, specifications that have been conventionally considered non-problematic in precision may require measurement with high accuracy. Examples of such specifications are the σ value of an illumination optical system, and the pupil transmittance distribution of a projection optical system.

An exposure apparatus has its atmosphere purged by, e.g., an inert gas to prevent impurities from adhering on its optical components. However, the long-term use of an exposure apparatus may lead to changes in σ value of an illumination optical system and in pupil transmittance distribution of a projection optical system due to contamination and deterioration of optical elements. An increase in resolution of an exposure apparatus inevitably makes changes in σ value of an illumination optical system and in pupil transmittance distribution of a projection optical system fall outside given tolerances.

Assume an exposure apparatus which mounts a measurement device for measuring the σ value of an illumination optical system and the pupil transmittance distribution of a projection optical system. In this case, the characteristics of the measurement device may change in response to changes in σ value of the illumination optical system and in pupil transmittance distribution of the projection optical system. As a consequence, changes in the σ value of the illumination optical system and the pupil transmittance distribution of the projection optical system, both of which are measured by the measurement device, may include changes in characteristics of the measurement device. To prevent this, a measurement device is calibrated as mounted in an exposure apparatus. Unfortunately, no techniques for such calibration are provided until now. Note that a measurement device for measuring the σ value of an illumination optical system and the pupil transmittance distribution of a projection optical system includes an image sensor including a two-dimensional array of a plurality of pixels. Note also that calibration of the measurement device may require calibration of the characteristics of the image sensor.

SUMMARY OF THE INVENTION

One of the aspects of the present invention provides an apparatus including an optical system for illuminating an original to project a pattern of the original onto a substrate, the apparatus comprising a measurement device which includes an image sensor arranged on a substrate stage that holds the substrate, and is configured to measure a characteristic of the optical system based on a light intensity distribution that is formed on an image sensing plane of the image sensor via the optical system and a measurement pattern and captured by the image sensor, a calibration pattern arranged to form a light intensity distribution having a known shape on the image sensing plane, and a controller configured to calibrate the measurement device based on the light intensity distribution by the calibration pattern and captured by the image sensor, and a theoretical light intensity distribution that is expected to be formed on the image sensing plane by the calibration pattern, wherein the calibration pattern is arranged around a region where the measurement pattern is arranged.

Further features of the present invention will become apparent from the following description of exemplary embodiments with reference to the attached drawings.

DESCRIPTION OF THE EMBODIMENTS

Embodiments of the present invention will be described below with reference to the accompanying drawings. However, the present invention is not limited to these embodiments.

Figure 1:
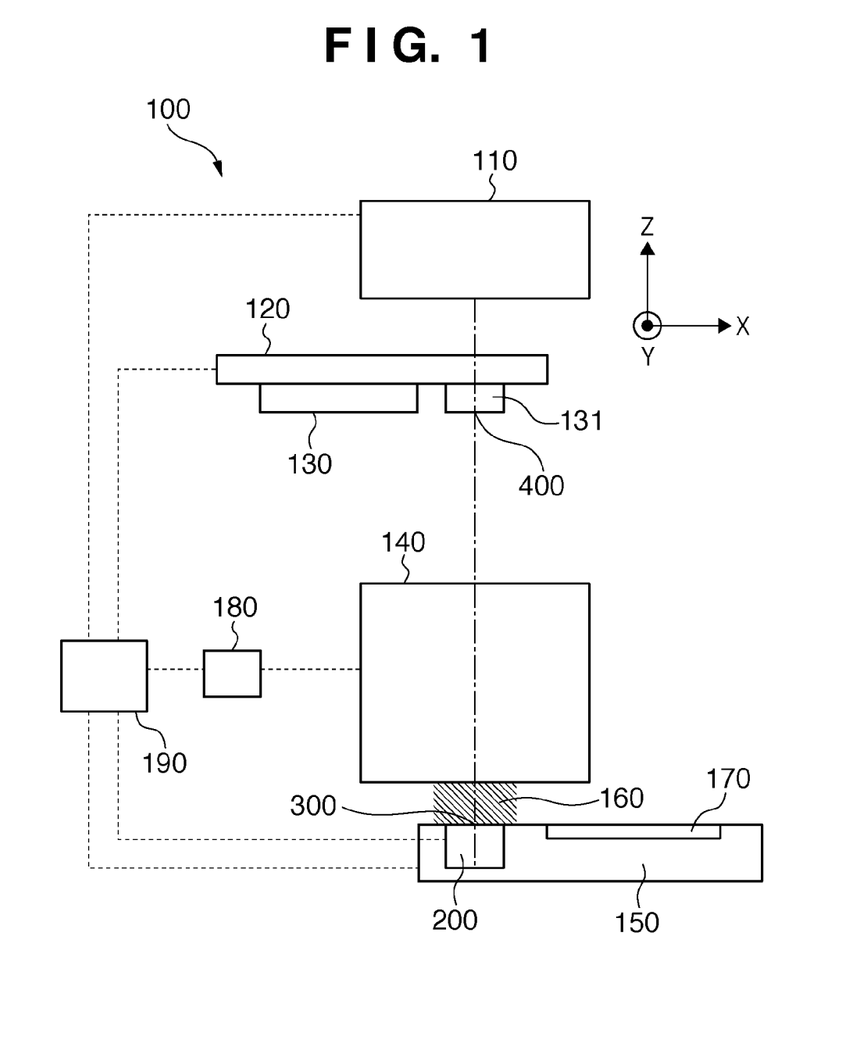
FIG. 1 is a view showing the schematic arrangement of an exposure apparatus according to an embodiment of the present invention.

FIG. 1 is a view showing the schematic arrangement of an exposure apparatus according to an embodiment of the present invention. The exposure apparatus according to the embodiment of the present invention includes an optical system for illuminating an original to project the pattern of the original onto a substrate, thereby exposing the substrate. The optical system can include an illumination system and projection optical system.

More specifically, an exposure apparatus 100 according to an embodiment of the present invention includes an illumination system 110, original stage 120, projection optical system 140, substrate stage 150, projection adjusting unit 180, controller 190, and measurement device 200. The original stage 120 holds an original 130 and original-side fiducial plate 131. The original 130 is held by an original chuck mounted on the original stage 120, and can be exchanged in accordance with the process involved. The original-side fiducial plate 131 can be fixed on the original stage 120. The substrate stage 150 includes a substrate chuck, which holds a substrate 170.

The exposure apparatus 100 can be configured to project the pattern of the original 130 onto the substrate 170 to expose the substrate 170 while the space between the substrate 170 and the whole or a part of the final surface of the projection optical system 140 on the image plane side (the side on which the substrate 170 is arranged) is filled with a liquid 160. Such an exposure apparatus is commonly called an immersion exposure apparatus. However, the application of the present invention is not limited to an immersion exposure apparatus. Also, although the exposure apparatus 100 is of the step & scan scheme, the present invention is also applicable to the step & repeat scheme or another exposure scheme.

The illumination system 110 is configured to illuminate the original 130 and includes a light source unit and illumination optical system. The light source unit can include, for example, a laser. Examples of the laser used are pulsed lasers such as an ArF excimer laser having a wavelength of about 193 nm, a KrF excimer laser having a wavelength of about 248 nm, or an $F_2$ laser having a wavelength of about 157 nm.

The illumination optical system illuminates the original 130 with light supplied from the light source unit, and can include, for example, a lens, mirror, light integrator, and stop. The light integrator can include a fly-eye lens, a cylindrical lens array (or a lenticular lens), an optical rod, or a diffractive element.

The original 130 is made of, for example, quartz and has a pattern, to be transferred onto a substrate, formed on it. Diffracted light emerging from the original 130 strikes the substrate 170 via the projection optical system 140 and liquid 160. The original 130 and substrate 170 are arranged in an optically conjugate relationship.

The pattern of the original 130 is transferred onto the substrate 170 by synchronously scanning the original 130 and substrate 170. When the exposure apparatus 100 is of the step & scan scheme (i.e., a stepper), it exposes the substrate 170 while the original 130 and substrate 170 stand still.

The original stage 120 is driven by a driving mechanism (not shown) while holding the original 130. The original stage 120 and projection optical system 140 can be instructed by a lens barrel support supported through a damper or the like by a base frame installed on the floor or the like. The driving mechanism includes, for example, a linear motor and drives the original stage 120 in the X and Y directions to move the original 130.

The original stage 120 includes the original-side fiducial plate 131 near the region where it holds the original 130. The position of a pattern unit 400 on the original-side fiducial plate 131 in the optical axis direction may or may not be flush with the pattern surface of the original 130.

The projection optical system 140 guides the light diffracted by the pattern of the original 130 to form an image on the substrate 170. The projection optical system 140 may be an optical system including a plurality of lens elements alone, or an optical system (catadioptric system) including a plurality of lens elements and at least one concave mirror. Alternatively, the projection optical system 140 may be an optical system including a plurality of lens elements and one diffractive optical element such as a kinoform, or may be another optical system. If chromatic aberration correction is to be obtained, a plurality of lens elements made of glass materials having different degrees of dispersion (Abbe numbers) are used, or the diffractive optical element is configured to cause dispersion in a direction opposite to that caused by the lens elements.

The substrate 170 is, for example, a wafer or a glass plate and is coated with a photosensitive agent (photoresist). The substrate stage 150 is driven by a driving mechanism (e.g., a linear motor; not shown) while holding the substrate 170. The original stage 120 and substrate stage 150 can be driven at a constant speed ratio while their positions are measured by, for example, a laser interferometer.

A substance which has a high transmittance for the exposure light, never makes dirt adhere onto the projection optical system 140, and matches the resist process is selected as the liquid 160. Again, a substance having a refractive index higher than 1 is selected as the liquid 160 in order to increase the NA of the projection optical system 140. Note that the difference in refractive index between the liquid 160 and a refractive member (lens) which forms the final surface of the projection optical system 140 can be compensated for by coating the final surface of the projection optical system 140.

The projection adjusting unit 180 includes a driving mechanism which drives optical elements of the projection optical system 140. The projection adjusting unit 180 adjusts the wavefront aberration, focus, and distortion of the projection optical system 140 by controlling the decentering and tilt of the axis of each optical element and the distance between the optical elements.

The controller 190 includes, for example, a function of configuring the measurement device 200, a function of calculating an optimum exposure condition, and a function of issuing a driving command to each driving mechanism. The controller 190 calculates an optimum exposure condition based on the measurement result obtained by the measurement device 200, and issues driving commands to the illumination system 110, the driving mechanism for the original stage 120, the driving mechanism for the substrate stage 150, and the projection adjusting unit 180.

The measurement device 200 includes a substrate-side pattern unit 300 and serves to measure the optical characteristics of the exposure apparatus 100. The space between the projection optical system 140 and the measurement device 200 can be filled with the liquid 160. The optical characteristics can include, for example, the illuminance distribution in the exposure region, the wavefront aberration of the projection optical system 140, the polarization state of the projection optical system 140, the numerical aperture of the projection optical system 140, the pupil transmittance of the projection optical system 140, the pupil distribution of the illumination system 110, the illumination σ or the effective light source distribution, and the polarization state of the illumination system 110. In this embodiment, the optical characteristics can be measured using at least one of the original-side pattern unit 400 and the substrate-side pattern unit 300.

A measurement pattern 410 is formed in the original-side pattern unit 400, and a measurement pattern 310 is formed in the substrate-side pattern unit 300 in order to measure the optical characteristics. The measurement patterns 410 and 310 can each include, for example, one or a plurality of pinhole or rectangular (e.g., square) openings, or one or a plurality of diffraction gratings. The opening used may be an opening having a dimension smaller than the wavelength of light emitted by the light source unit of the illumination system 110 (i.e., an opening which gives rise to ideal diffraction), or may be an opening having a dimension larger than that wavelength. The directions in which an opening (e.g., a slit) or a diffraction grating extends can be, for example, 0°, 90°, 45°, or 135°, but are not limited to them. The diffraction grating is not limited to a line-and-space pattern, and may have a two-dimensional pattern. The periphery of the opening or the diffraction grating is covered with a light-shielding film.

Figure 2A:
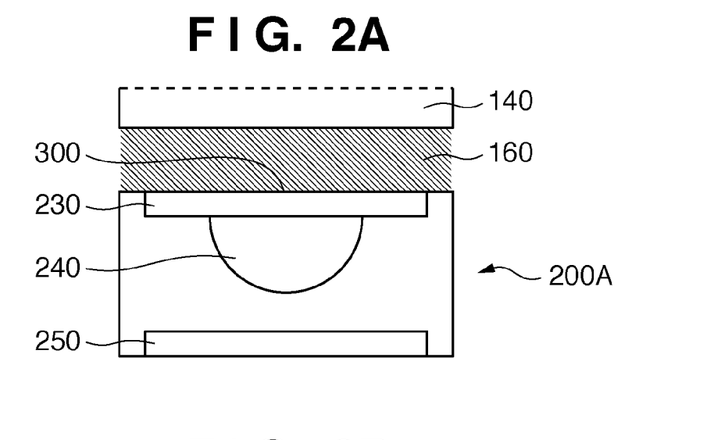
FIGS. 2A and 2B are views illustrating the configurations of measurement devices for measuring the optical characteristics.
Figure 2B:
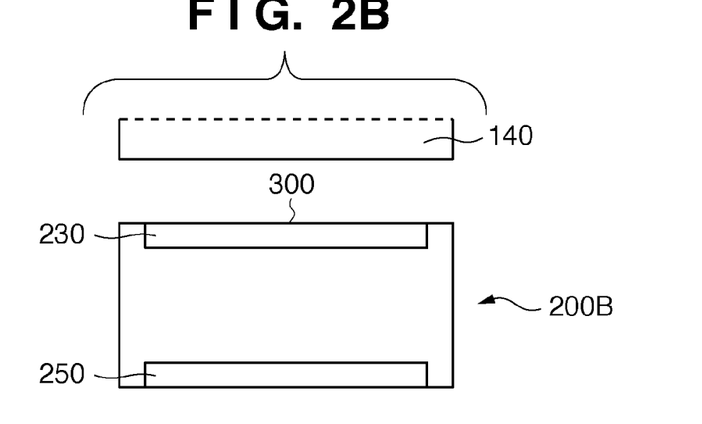

FIG. 2A shows the first configuration example (a measurement device 200A) of the measurement device 200. FIG. 2B shows the second configuration example (a measurement device 200B) of the measurement device 200. The space between the measurement device 200A and the projection optical system 140 is filled with the liquid 160. The measurement device 200A includes a glass substrate 230, planoconvex lens 240, and image sensor 250. The glass substrate 230 has the substrate-side pattern unit 300. The planoconvex lens 240 is juxtaposed to the glass substrate 230 so as to be spaced apart from it by a distance smaller than the wavelength of light emitted by the light source unit. This arrangement prevents the light having passed through the substrate-side pattern unit 300 from being totally reflected by the lower surface of the glass substrate 230. The space between the planoconvex lens 240 and the image sensor 250 may be filled with a gas such as air or an inert gas or a high-refractive-index liquid such as the liquid 160.

The measurement device 200 may include a polarizer and an analyzer in order to measure the polarization state of the projection optical system 140. Instead of juxtaposing the glass substrate 230 and planoconvex lens 240 as in the foregoing description, they may be combined into a single optical member. The planoconvex lens 240 may not be a single lens, and may be a set of a plurality of lenses.

In the case of dry exposure in which the space between the projection optical system 140 and the measurement device 200 is not filled with a liquid, the measurement device 200B, as illustrated in FIG. 2B, may be used. The measurement device 200B includes a glass substrate 230 and image sensor 250. The glass substrate 230 includes the substrate-side pattern unit 300, as in the measurement device 200A.

The glass substrate 230 is covered with a light-shielding film in its region other than the substrate-side pattern unit 300. The light-shielding film serves to cut off stray light from the surrounding region other than the substrate-side pattern unit 300, and can be formed from a thin film made of, e.g., Cr, Ta, W, or Si. In one embodiment, a light-shielding film used in an immersion exposure apparatus does not change the properties of the liquid 160 even when light impinges on the light-shielding film.

When the optical characteristics of an exposure apparatus are measured using a measurement device 200, measurement errors often occur due to the sensitivity nonuniformity among the pixels of an image sensor 250 mounted on the measurement device 200 and factors associated with the incident angle characteristic of the image sensor 250. Assume herein that the sensitivity nonuniformity and incident angle characteristic of the image sensor 250 attributed to itself alone are calibrated. Even in this case, that calibration does not calibrate the incident angle characteristic of the image sensor 250, which is determined depending on the positional relationship between the pixels of the image sensor 250 and a substrate-side pattern unit 300 when the image sensor 250 is built in the measurement device 200. A conventional exposure apparatus has no function of illuminating a measurement device with a known illumination distribution, so the measurement device 200 cannot be calibrated as mounted in the exposure apparatus.

In the first embodiment of the present invention, the measurement device 200 is calibrated as mounted in the exposure apparatus by forming a known illumination distribution in the exposure apparatus. This makes it possible to measure the optical characteristics of an optical system in the exposure apparatus with high accuracy.

Figure 3:
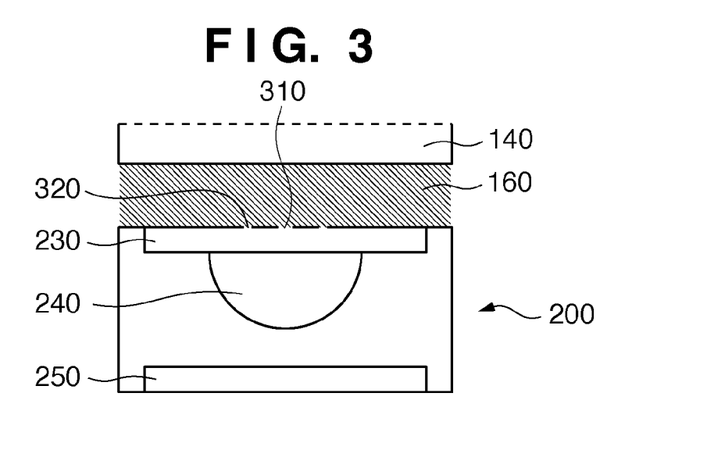
FIG. 3 is a view showing an example of a configuration for calibrating the sensitivity nonuniformity and incident angle characteristic of an image sensor of the measurement device while the measurement device is mounted in the exposure apparatus.

FIG. 3 is a view showing an example of a configuration for calibrating the sensitivity nonuniformity and incident angle characteristic of the image sensor 250 of the measurement device 200 while the measurement device 200 is mounted in the exposure apparatus. The substrate-side pattern unit 300 includes a measurement pattern 310 for measuring the optical characteristics of an optical system in the exposure apparatus, and a calibration pattern 320 for calibrating the image sensor 250 (measurement device 200). Although a case in which the pupil distribution of an illumination system 110 is measured as the optical characteristic of the exposure apparatus will be exemplified herein, the measurement principle in this case is obviously applicable to measurement of other optical characteristics of the exposure apparatus. In this specification, the measurement pattern 310 for measuring the optical characteristics of the exposure apparatus is assumed to be one constituent component of the measurement device 200. Also, the calibration pattern 320 for calibrating the image sensor 250 (measurement device 200) is assumed to be one constituent component of the configuration for calibrating the image sensor 250 (measurement device 200).

Figure 4:
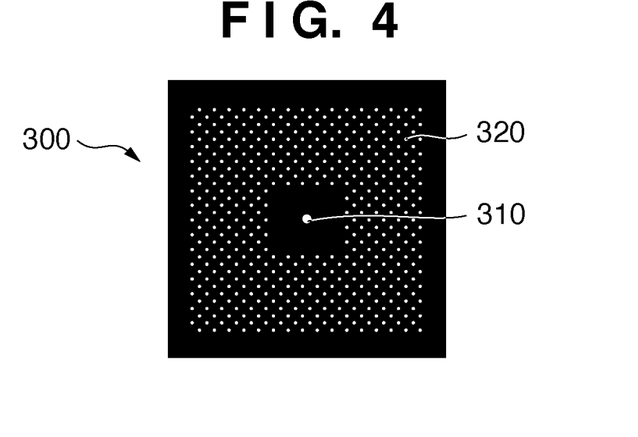
FIG. 4 is a view showing a detailed example of a substrate-side pattern unit arranged on the side of a substrate stage.

FIG. 4 is a view showing a detailed example of the substrate-side pattern unit 300 arranged on the side of a substrate stage 150. The measurement pattern 310 in the substrate-side pattern unit 300 is a pattern for measuring the pupil distribution of the illumination system 110 and, more specifically, is a pattern having a pinhole. The diameter of the pinhole in the measurement pattern 310 can be optimized by taking account of the light reception sensitivity of the image sensor 250, and measurement errors that occur due to a geometrical blur and a diffraction blur attributed to the diameter of the pinhole.

The calibration pattern 320 is a pattern having a plurality of minute pinholes. The diameter of each pinhole in the calibration pattern 320 is smaller than the wavelength of light emitted by a light source, but may be nearly equal to or larger than that wavelength. The smaller the pinhole diameter, the more greatly the characteristic of the incident light on the calibration pattern 320 can be canceled. This results in a small calibration residual of the image sensor 250. When the pinhole diameter is smaller than the wavelength of light emitted by the light source, the transmittance of the calibration pattern 320 for that light is relatively low. In this case, however, the amount of light transmitted through the calibration pattern 320 can be increased by forming a plurality of pinholes in it.

Figure 5A:
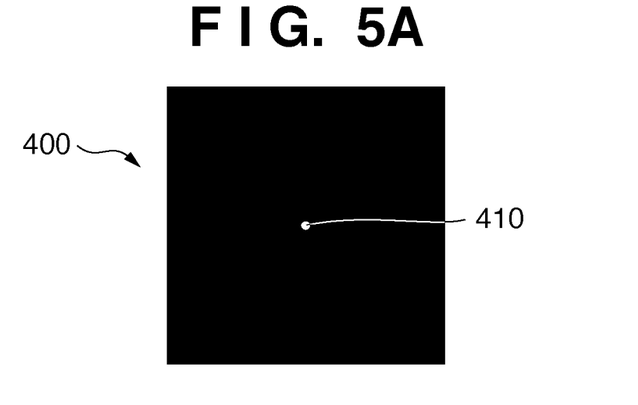
FIGS. 5A and 5B are views showing a detailed example of an original-side pattern unit arranged on an original stage.
Figure 5B:
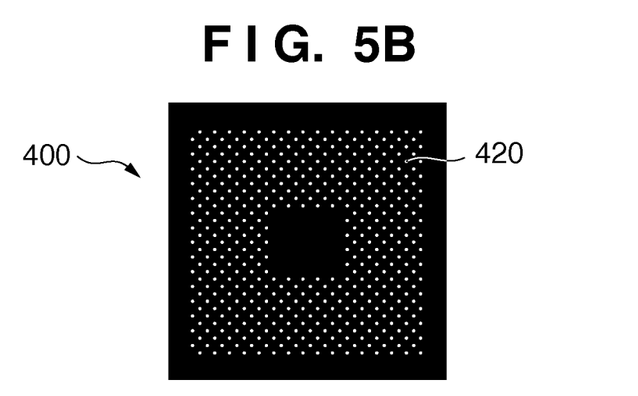

FIGS. 5A and 5B are views showing a detailed example of an original-side pattern unit 400 arranged on an original stage 120. The original-side pattern unit 400 includes a measurement pattern for measuring the pupil distribution of the illumination system 110 as a measurement pattern 410 for measuring the optical characteristics of the exposure apparatus, as illustrated in FIG. 5A. The original-side pattern unit 400 also includes a calibration pattern 420 similar to the calibration pattern 320 in order to illuminate the calibration pattern 320 in the substrate-side pattern unit 300, as illustrated in FIG. 5B.

The original-side calibration pattern 420 is used to illuminate the substrate-side calibration pattern 320. The original-side measurement pattern 410 and original-side calibration pattern 420 are selectively used by driving the original stage 120. The substrate-side pattern unit 300 and original-side pattern unit 400 are designed by taking account of, e.g., the imaging magnification of a projection optical system 140. In one embodiment, the patterns 410 and 420 in the original-side pattern unit 400 are larger than the patterns 310 and 320, respectively, in the substrate-side pattern unit 300. This is to facilitate alignment between the patterns 410 and 420 in the original-side pattern unit 400 and the patterns 310 and 320, respectively, in the substrate-side pattern unit 300.

Figure 6:
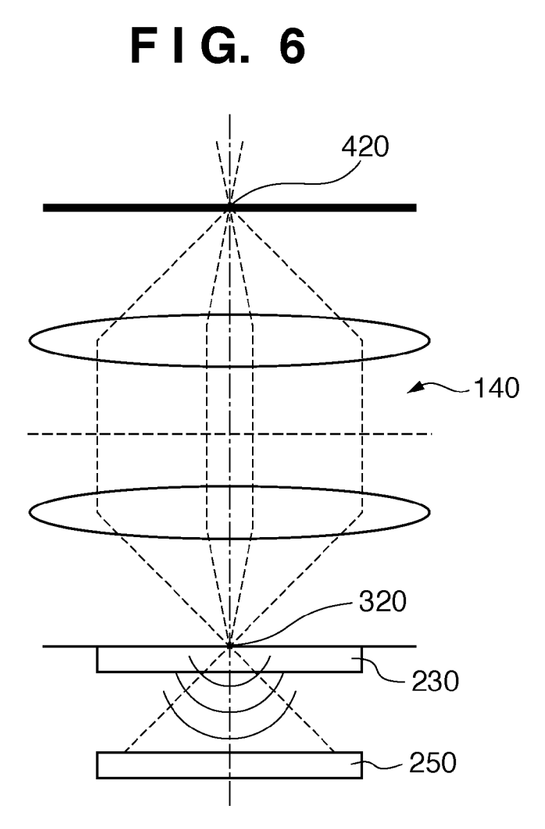
FIG. 6 is a view showing the arrangement in calibrating the image sensor of the measurement device using an original-side calibration pattern and a substrate-side calibration pattern.

FIG. 6 is a view showing the arrangement in calibrating the image sensor 250 of the measurement device 200 using the original-side calibration pattern 420 and substrate-side calibration pattern 320. Although the illumination system 110 illuminates the calibration pattern 420 in a low-σ illumination mode in this embodiment, it may illuminate the calibration pattern 420 in a high-σ illumination mode. The calibration pattern 320 is illuminated with light sequentially transmitted through the original-side calibration pattern 420 and projection optical system 140. The light beams diffracted by the plurality of pinholes in the substrate-side calibration pattern 320 arranged on the side of the substrate stage 150 are output and synthesized on the image sensing plane of the image sensor 250. A light intensity distribution formed on the image sensing plane can be calculated. Minimizing telecentricity errors between given illumination modes makes it possible to reduce intensity errors in a theoretical light intensity distribution formed by the substrate-side calibration pattern 320. This, in turn, makes it possible to reduce a calibration residual of the image sensor 250.

Figure 7:
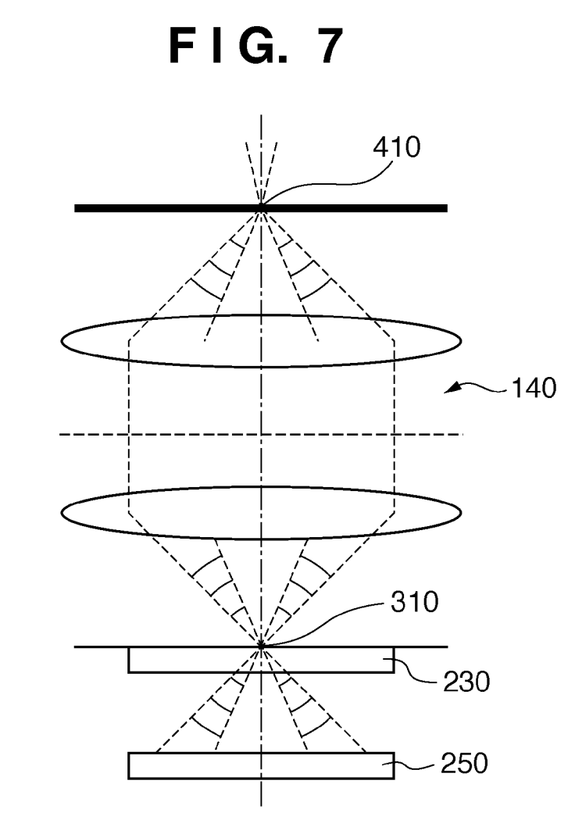
FIG. 7 is a view showing the arrangement in measuring the pupil distribution of an illumination system.

After the image sensor 250 (measurement device 200) is calibrated, the pupil distribution of the illumination system 110 (the optical characteristic of the exposure apparatus) is measured. FIG. 7 is a view showing the arrangement in measuring the pupil distribution of the illumination system 110. FIG. 7 schematically shows measurement of the pupil distribution in annular illumination.

On the side of the original stage 120, the calibration pattern 420 is used in the calibration shown in FIG. 6, and the measurement pattern 410 is used in the optical characteristic measurement shown in FIG. 7. The calibration pattern 420 or measurement pattern 410 is selected by driving the original stage 120. On the side of the substrate stage 150, the measurement pattern is arranged inside the calibration pattern 320, and hence there is no need to drive the substrate stage 150 in a process shift between the calibration and the measurement.

In this embodiment, the substrate-side pattern unit 300 illustrated in FIG. 4, which is arranged on the side of the substrate stage 150, includes the calibration pattern 320 arranged so as to surround the region, where the measurement pattern 310 is arranged, in the periphery of the region where the measurement pattern 310 is arranged. Note that the calibration pattern 320 includes a plurality of pinholes (optical elements) symmetrically (typically, point-symmetrically) formed outside the measurement pattern. A configuration in which the calibration pattern 320 is arranged so as to surround the region where the measurement pattern 310 is arranged is excellent in that the positional relationship between the measurement pattern 310 and the calibration pattern 320 remains the same between the measurement and the calibration.

Figure 9:
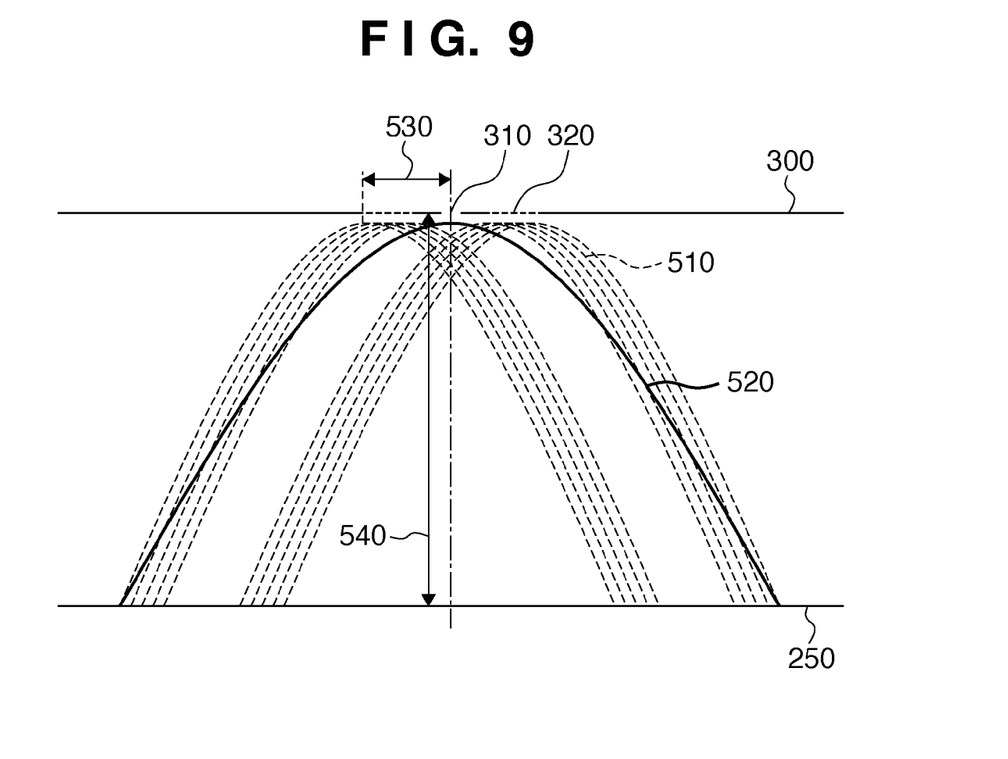
FIG. 9 is a view exemplifying a light intensity distribution formed on the image sensing plane of the image sensor by the calibration pattern illustrated in FIG. 4.

FIG. 9 exemplifies a light intensity distribution formed on the image sensing plane of the image sensor 250 by the calibration pattern 320 in the substrate-side pattern unit 300 illustrated in FIG. 4. The light beams diffracted by the respective pinholes in the calibration pattern 320 form light intensity distributions indicated by broken lines 510. A light intensity distribution indicated by a solid line 520 is formed by synthesizing the light intensity distributions indicated by the broken lines 510. The calibration pattern 320 is designed such that the distance between the pinholes is an incoherence length so as to prevent the light beams emerging from the respective pinholes from interfering with each other. A calibration residual can be reduced by configuring the measurement device 200 such that a pinhole distance 530 and a defocus amount 540 satisfy:

$$\sin(\tan^{-1}(\text{pinhole distance/defocus amount}) < 0.1 \qquad (1)$$

Note that the pinhole distance 530 is the distance between the measurement pattern 310 and a pinhole farthest from the measurement pattern 310 of the plurality of pinholes which constitute the calibration pattern 320.

The positions of the measurement pattern 310 and calibration pattern 320 are different from each other. Accordingly, the angles at which the light beams emerging from the measurement pattern 310 and calibration pattern 320 enter the pixels of the image sensor 250 are also different from each other. However, when inequality (1) is satisfied, the light beams emerging from the measurement pattern 310 and calibration pattern 320 can be approximately regarded as entering the pixels of the image sensor 250 at nearly the same angle. Hence, a light intensity distribution formed on the image sensing plane of the image sensor 250 by the light from the pinholes in the calibration pattern 320 can be calculated as the intensity distribution of ideal diffracted light coming from the position of the measurement pattern 310 as a point light source. Even the thus obtained calculation result can satisfy the illumination σ measurement accuracy (e.g., a measurement accuracy<0.003σ) used for the current exposure apparatus.

The calibration pattern 320 has a plurality of minute pinholes. If the diameter of each pinhole in the calibration pattern 320 is different from a design value, a calibration residual of the image sensor 250 occurs. To prevent this, the diameter of each pinhole in the calibration pattern 320 is measured before assembling a glass substrate 230 including the calibration pattern 320. Instead of measuring the diameters of all of the plurality of pinholes, the plurality of pinholes may be grouped into a plurality of regions, and the diameter of a representative pinhole in each region may be measured. A sensor calibration residual can be reduced by setting a standard for the pinhole diameter measurement result obtained in each region. The image sensor 250 can be calibrated with high accuracy by comparing a theoretical light intensity distribution that is expected to be formed on the image sensing plane of the image sensor 250 by pinholes having the measured diameters with an actual light intensity distribution that is formed on the image sensing plane of the image sensor 250 and captured by the image sensor 250.

Figure 8:
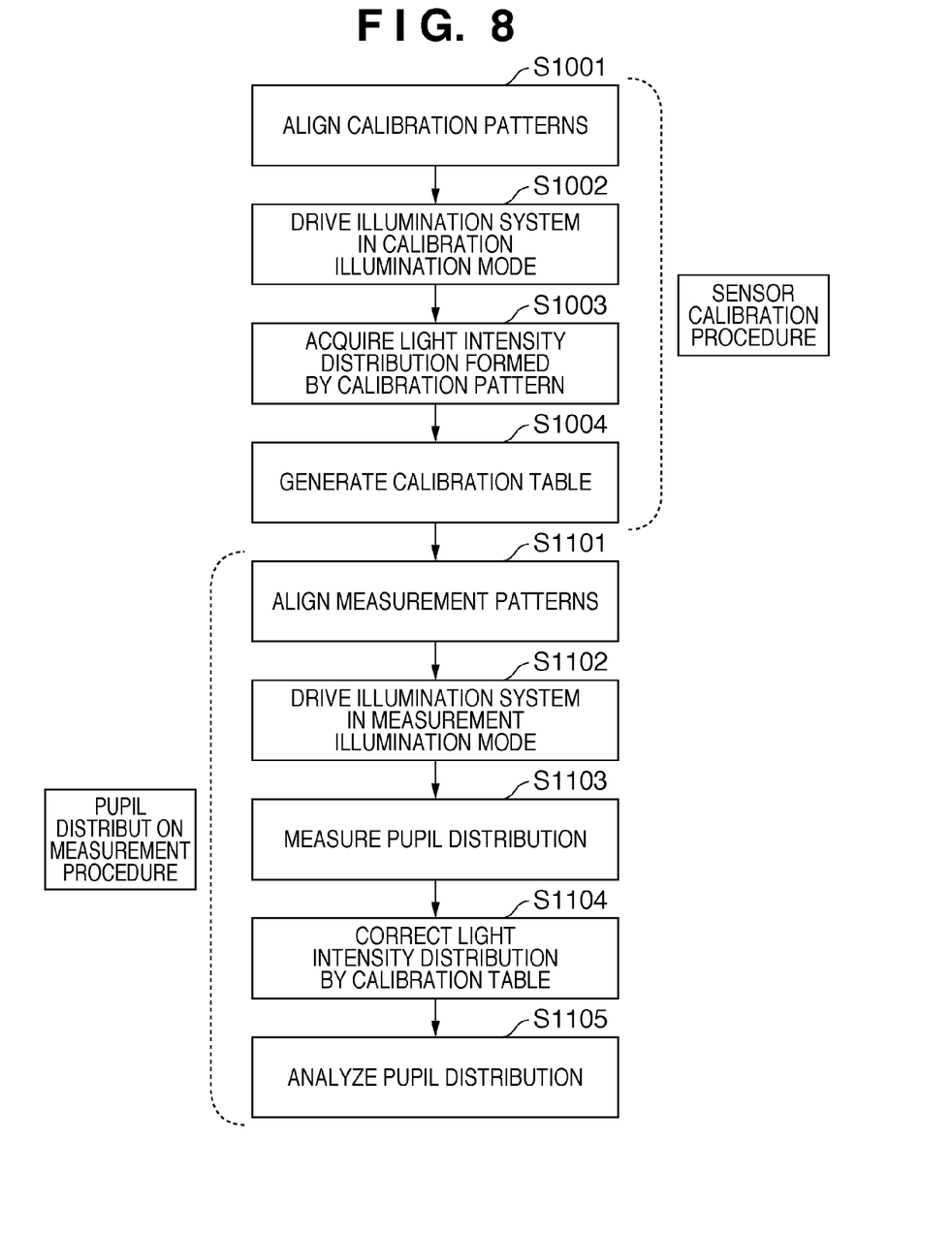
FIG. 8 is a flowchart showing the procedure of calibration of an image sensor (measurement device) and the procedure of measurement of the pupil distribution (optical characteristic) in an embodiment of the present invention.

FIG. 8 is a flowchart showing the procedure of calibration of an image sensor (measurement device) and the procedure of measurement of the pupil distribution (optical characteristic) in an embodiment of the present invention. In FIG. 8, steps S1001 to S1004 show the procedure of calibration of the measurement device 200 including the image sensor 250. Also, steps S1101 to S1105 show the procedure of measurement of the pupil distribution (the optical characteristic of an optical system). A controller 190 in the exposure apparatus controls the process shown in FIG. 8.

In step S1001 (align calibration patterns), under the control of the controller 190, the original stage 120 and substrate stage 150 are driven to align the original-side calibration pattern 420 arranged on the side of the original stage 120 with the substrate-side calibration pattern 320 arranged on the side of the substrate stage 150.

In step S1002 (drive illumination system in calibration illumination mode), the controller 190 sets the illumination system 110 to an illumination mode for calibrating the characteristics of sensitivity of the image sensor 250.

In step S1003 (acquire light intensity distribution formed by calibration pattern), the illumination system 110 illuminates the substrate-side calibration pattern 320 via the original-side calibration pattern 420 and projection optical system 140 under the control of the controller 190. The controller 190 causes the image sensor 250 to capture a light intensity distribution (image) formed on the image sensing plane of the image sensor 250 by the substrate-side calibration pattern 320 to acquire the captured light intensity distribution as an image. A light intensity distribution formed on the image sensing plane of the image sensor 250 by the substrate-side calibration pattern 320 is a light intensity distribution having a known shape determined depending on the arrangement of the substrate-side calibration pattern 320.

In step S1004, a calibration table is generated based on the ratio between the light intensity distribution acquired using the image sensor 250 in step S1003 and the light intensity distribution (ideal distribution) calculated based on the data of the substrate-side calibration pattern 320. The calibration table has a calibration value per pixel or per unit area (i.e., a two-dimensional map of the calibration values forms the calibration table). Let MV be the value in the light intensity distribution acquired using the image sensor 250 in step S1003, and CV be the value in the light intensity distribution (ideal distribution) calculated based on the data of the substrate-side calibration pattern 320. Then, a calibration value C is given by:

$$C = MV/CV \times 100 \qquad (2)$$

The actual measurement value of the diameter of each pinhole in the substrate-side calibration pattern 320 is used to calculate the light intensity distribution in step S1004. The representative value or average value of the pinhole diameters in respective regions each grouping a set of pinholes can be used to calculate a light intensity distribution formed on the image sensing plane by light ideally diffracted by a point light source. If the distribution of the diameters of a plurality of pinholes in the substrate-side calibration pattern 320 has a gradient or is not uniform, the gradient or nonuniformity may turn into a calibration residual, leading to an asymmetrical error in the pupil measurement result. The nonuniformity of the pinhole diameters in fabricating the substrate-side calibration pattern 320 is to be reduced.

The procedure of measurement of the pupil distribution of the illumination system 110 will be explained next. In step S1101, the original stage 120 and substrate stage 150 are driven to align the original-side measurement pattern 410 with the substrate-side measurement pattern 310.

In step S1102 (drive illumination system in measurement illumination mode), the controller 190 sets the illumination system 110 to an illumination mode for measuring the pupil distribution.

In step S1103 (measure pupil distribution), the illumination system 110 illuminates the measurement pattern 310 via the measurement pattern 410 and projection optical system 140 under the control of the controller 190. The controller 190 causes the image sensor 250 to capture a light intensity distribution (image) formed on the image sensing plane of the image sensor 250 by the measurement pattern 310 to acquire the captured light intensity distribution as an image. The acquired light intensity distribution (image) bears information representing the pupil distribution of the illumination system 110 as its characteristic.

In step S1104 (correct light intensity distribution by calibration table), the controller 190 corrects the light intensity distribution (the pupil distribution before correction), acquired in step S1103, using the calibration table generated in step S1004 to obtain the pupil distribution of the illumination system 110. A value P of each pixel (coordinate) which constitutes the pupil distribution can be calculated in accordance with:

$$P = I/C \times 100 \qquad (3)$$

where I is the value of each pixel which constitutes the light intensity distribution acquired in step S1103.

In step S1105, the controller 190 analyzes, e.g., telecentricity and σ value in the set illumination mode using the pupil distribution corrected in step S1104.

In the above-mentioned example, a light intensity distribution having a known shape is formed on the image sensing plane of the image sensor 250 using the substrate-side calibration pattern 320 illuminated via the original-side calibration pattern 420. Instead of this, the pupil distribution of the illumination system 110 attributed to itself alone can be measured by forming a light intensity distribution having a known shape on the image sensing plane of the image sensor 250 by the pattern arranged on the original side.

Figure 10:
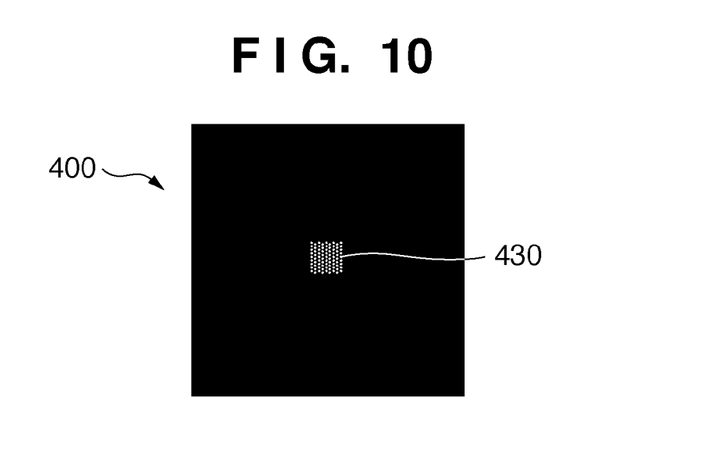
FIG. 10 is a view showing a pattern for measuring the pupil distribution of the illumination system attributed to itself alone.

FIG. 10 is a view showing a pattern for measuring the pupil distribution of the illumination system 110 attributed to itself alone. The original-side pattern unit 400 on the original-side fiducial plate 131 includes an ideal distribution forming pattern 430. The size of the region where the ideal distribution forming pattern 430 is formed is to be determined in conformity to the substrate-side measurement pattern 310. Note that the ideal distribution means a light intensity distribution having a known shape.

Figure 11:
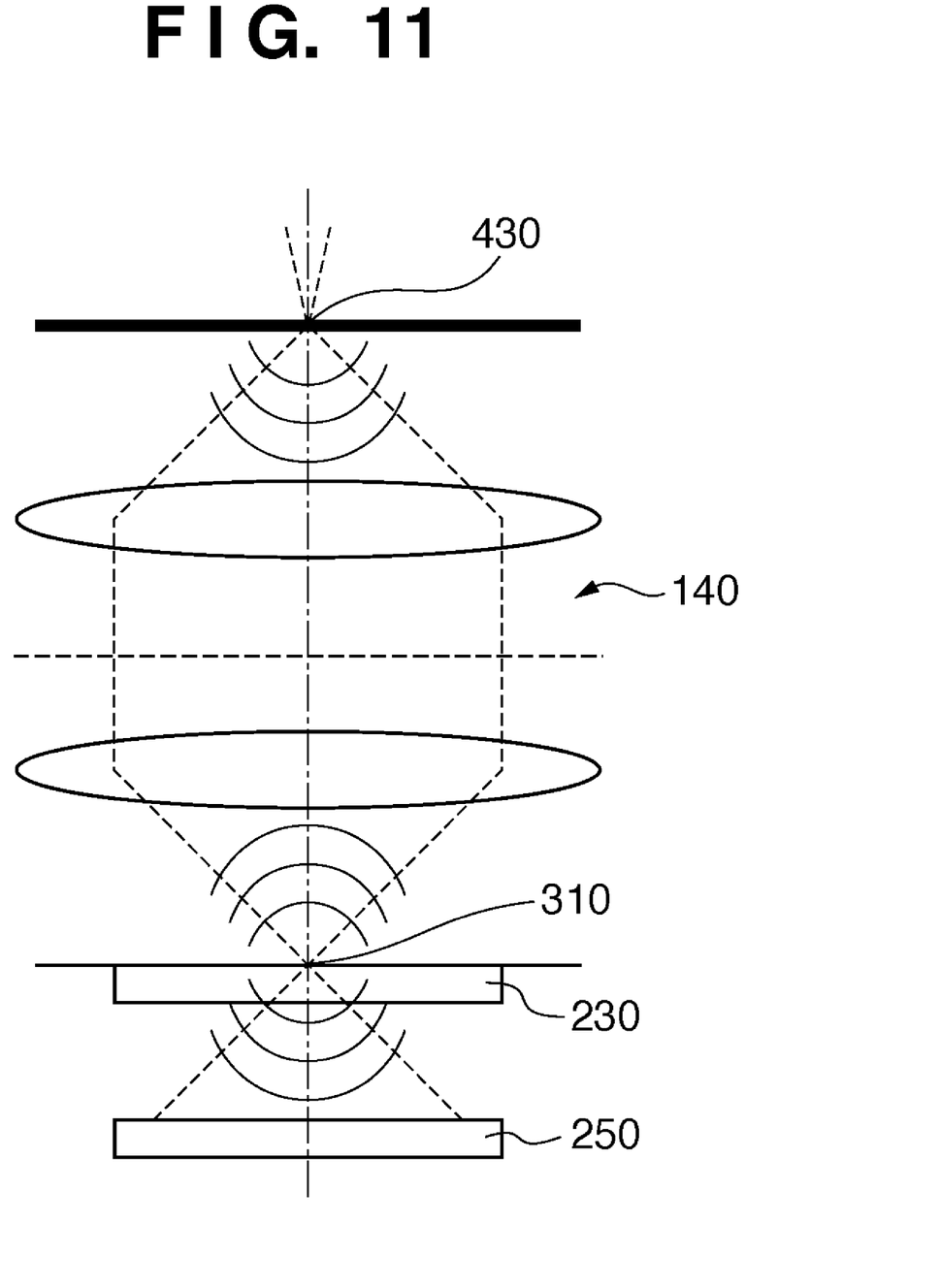
FIG. 11 is a view showing the arrangement in forming an ideal distribution on the image sensing plane of the image sensor by an ideal distribution forming pattern.

FIG. 11 is a view showing the arrangement in forming an ideal distribution on the image sensing plane of the image sensor 250 by the ideal distribution forming pattern 430. Light with which the illumination system 110 illuminates the original-side ideal distribution forming pattern 430, and which has passed through the ideal distribution forming pattern 430 forms a light intensity distribution on the image sensing plane of the image sensor 250 upon passing through the substrate-side measurement pattern 310. A table for correcting the measurement result of the pupil distribution of the illumination system 110 is generated based on the ratio between the light intensity distribution captured by the image sensor 250 and the ideal distribution calculated based on the data of the ideal distribution forming pattern 430.

The procedure of configuring the image sensor 250 using the ideal distribution forming pattern 430 is basically the same as in the flowchart shown in FIG. 8. The difference lies in that the ideal distribution forming pattern 430 and measurement pattern 310 are aligned with each other in step S1001. In step S1004, a calibration table is determined based on the ratio between the light intensity distribution measured in step S1003 and the theoretical light intensity distribution (ideal distribution) obtained based on the data of the ideal distribution forming pattern 430. The data of the ideal distribution forming pattern 430 may be design values or the actual measurement values of the diameters and arrangement of the pinholes in the ideal distribution forming pattern 430.

The optical characteristics of the illumination system 110 attributed to itself alone can be measured by arranging the ideal distribution forming pattern 430 on the original side and measuring the pupil distribution of the illumination system 110. Moreover, the pupil transmittance distribution of the projection optical system 140 can be obtained based on the calibration table obtained by measurement using the substrate-side calibration pattern 320 and that obtained by measurement using the original-side ideal distribution forming pattern 430. At this time, the light control condition and the measurement light amount during each measurement can be taken into consideration.

As described above, in the first embodiment, the optical characteristics of the exposure apparatus are measured using the measurement device 200 by forming a light intensity distribution having a known shape on the main body of the exposure apparatus, and calibrating the image sensor 250. This makes it possible to directly calibrate the pixels of the image sensor 250 used to measure the optical characteristics of the exposure apparatus. This, in turn, makes it possible to measure the optical characteristics of the exposure apparatus with high accuracy.

Although substrate-side optical characteristic measurement has been exemplified in the first embodiment, the present invention is also applicable to original-side optical characteristic measurement. When a measurement device is arranged on the original side, a pattern can be arranged at a position optically conjugate to the original and the substrate in the illumination system 110.

Although a pattern having pinholes is used to form an ideal distribution in the first embodiment, this is not indispensable. H/V slits, for example, may be used for correction which takes account of the polarization state. Preparing slits extending in the 0°, 45°, 90°, and 135° directions allows the selective use of these slits in correspondence with the polarization state. This makes it possible to even calibrate the sensor angle characteristic of an intensity distribution oscillating in a specific direction. Besides this alternative technique, a diffusing member or a diffractive element can be used in place of pinholes.

After the long-term operation of an exposure apparatus, only measurement of the σ value of an illumination system 110 and the pupil transmittance distribution of a projection optical system 140 is insufficient to discriminate whether the exposure apparatus or a measurement device 200 has changed.

In the second embodiment of the present invention, the measurement device 200 (an image sensor 250) is calibrated on the main body of the exposure apparatus, periodically or according to a given plan. This makes it possible to monitor a temporal change in optical characteristics of the exposure apparatus.

To monitor a temporal change in optical characteristic of the exposure apparatus, a controller 190 performs the processes in steps S1001 to S1004 in FIG. 8, periodically or according to a given plan. The exposure condition can be optimized by reflecting the analysis result obtained in step S1105 on a command value issued from the controller 190.

The controller 190 can perform a process for monitoring a temporal change in optical characteristic of the exposure apparatus, periodically or according to a given plan, by mounting an original for calibration of the image sensor 250 in the exposure apparatus. A temporal change in optical characteristic of the projection optical system 140 can be monitored by calibrating the measurement device 200, periodically or according to a given plan, using a substrate-side calibration pattern 320 illustrated in FIG. 4, and measuring the optical characteristics of the projection optical system 140 by the measurement device 200 calibrated. In addition, a temporal change in optical characteristic of the illumination system 110 attributed to itself alone can be monitored by calibrating the measurement device 200, periodically or according to a given plan, using an ideal distribution forming pattern 430 illustrated in FIG. 10, and measuring the optical characteristics of the illumination system 110 attributed to itself alone by the measurement device 200. Furthermore, the pupil transmittance distribution of the projection optical system 140 can be obtained based on the calibration table obtained using the substrate-side calibration pattern 320 and that obtained using the original-side ideal distribution forming pattern 430. Hence, it is also possible to monitor a temporal change in pupil transmittance distribution of the projection optical system 140.

As described above, in the second embodiment, a temporal change in optical characteristic of the exposure apparatus can be monitored with high accuracy by calibrating the measurement device 200 (image sensor 250) on the main body of the exposure apparatus, periodically or according to a given plan, and measuring the optical characteristics of the exposure apparatus using the measurement device 200 calibrated.

Measurement errors also occur due to the tilt of an image sensor 250, and the amount of defocus of the image sensor 250 from the image plane. In addition, in manufacturing one product using a plurality of exposure apparatuses, importance is attached especially to adjustment of the individual differences among the plurality of exposure apparatuses.

Assume that the specifications such as the thicknesses of a glass substrate 230 and planoconvex lens 240, their distances to the image sensor 250, and the tilt of the image sensor 250 are measured during assembly of a measurement device 200. Even in this case, it is impossible to perfectly compensate for the individual differences among more than one exposure apparatus corresponding to measurement errors of these characteristics. In addition, it is difficult to discriminate between a component attributed to a change of the exposure apparatus and that attributed to a change in the above-mentioned specifications of the measurement device 200 in the measurement results of the optical characteristics of the measurement device 200 obtained over a long period of time.

In the third embodiment of the present invention, the tilt and defocus amount of the image sensor 250 are measured on the main body of the exposure apparatus. This makes it possible to measure the optical characteristics of the exposure apparatus with high accuracy. It is also possible to compensate for the individual differences among the measurement devices 200 of more than one exposure apparatus by adjusting the measurement devices 200 with respect to one reference. It is still also possible to monitor a temporal change in optical characteristics of the exposure apparatus with high accuracy by adjusting the measurement device 200 periodically or according to a given plan.

Figure 12A:
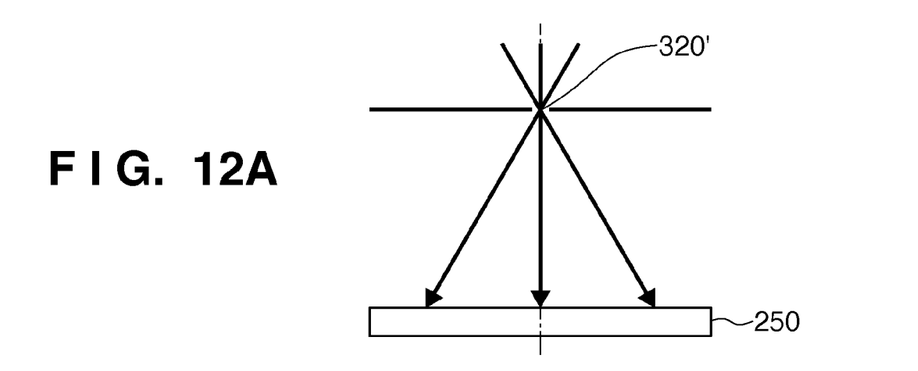
FIGS. 12A to 12C are conceptual diagrams showing the states in which the defocus amount and tilt of an image sensor are measured.
Figure 12B:
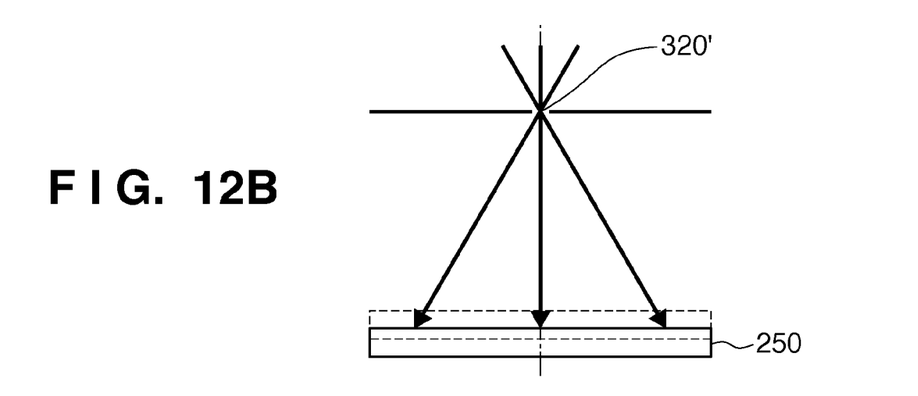
Figure 12C:
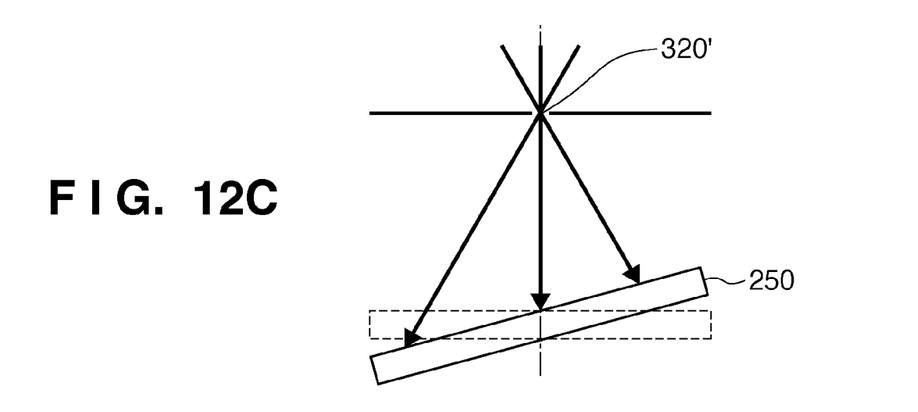

FIGS. 12A to 12C are conceptual diagrams showing the states in which the defocus amount and tilt of the image sensor 250 are measured. The measurement device 200 includes a calibration pattern 320' and the image sensor 250. The image sensing plane of the image sensor 250 is illuminated via the calibration pattern 320'. A plurality of light beams emerge from the calibration pattern 320' in different directions. The conceptual views in FIGS. 12A to 12C each show three light beams having different exit angles (incident angles on the image sensing plane) from the calibration pattern 320'. In one embodiment, one of these three light beams has an exit angle of 0° (is parallel to the optical axis of the projection optical system 140). As long as the light beam from the calibration pattern 320' has a known exit angle, the position at which the light beam strikes the image sensor 250 is determined. Assume that FIG. 12A shows a reference state. Then, FIG. 12B shows a state in which the defocus amount of the image sensor 250 is relatively large. Also, FIG. 12C shows a state in which the image sensor 250 is tilted. The defocus amount and tilt of the image sensor 250 can be obtained based on the positions at which three or more light beams having known exit angles from the calibration pattern 320' strike the image sensor 250. FIGS. 12A to 12C represent the one-dimensional incident positions of the incident light beams on the image sensor 250. However, it is also possible to measure the rotation of the image sensor 250 (the rotation of an optical system about the optical axis (about the Z-axis)) with respect to the calibration pattern 320' by extending the same logic as in a one-dimensional system to a two-dimensional system.

Figure 13:
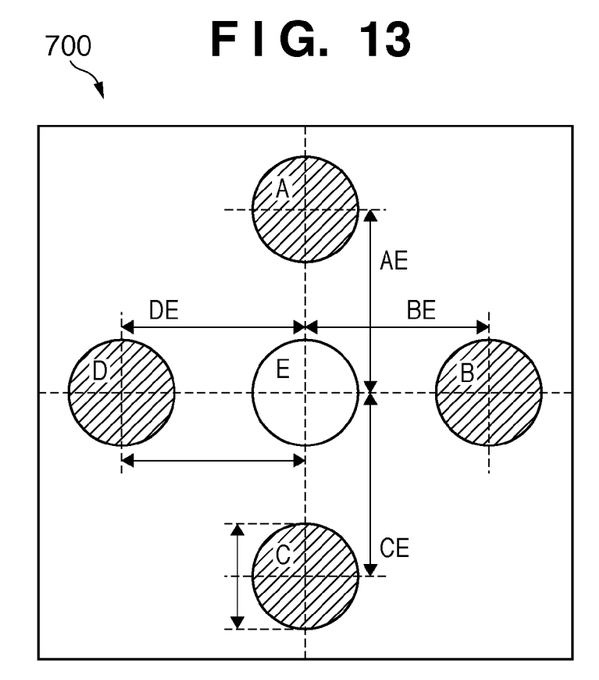
FIG. 13 is a schematic diagram showing the pupil distribution in measuring the defocus amount and tilt of the image sensor.

FIG. 13 is a diagram illustrating a group of light intensity distributions (pupil distributions) formed in different regions on the image sensing plane of the image sensor 250 by five light beams having known exit angles from the calibration pattern 320'. The light intensity distributions formed by the five light beams are defined as A, B, C, D, and E herein. Also, let A(xa, ya), B(xb, yb), C(xc, yc), D(xd, yd), and E(xe, ye) be the centroids of the light intensity distributions A, B, C, D, and E, respectively. Further, let AE be the distance between the centroids of the light intensity distributions A and E, BE be the distance between the centroids of the light intensity distributions B and E, CE be the distance between the centroids of the light intensity distributions C and E, and DE be the distance between the centroids of the light intensity distributions D and E. Then, the inter-centroid distances AE, BE, CE, and DE are given by:

$$AE=\{(xa-xe)^2+(ya-ye)^2\}^{1/2}$$

$$BE=\{(xb-xe)^2+(yb-ye)^2\}^{1/2}$$

$$CE=\{(xc-xe)^2+(yc-ye)^2\}^{1/2}$$

$$DE=\{(xd-xe)^2+(yd-ye)^2\}^{1/2} \tag{4}$$

Let DNA be the deviation from an appropriate defocus amount of the image sensor 250 by KNA. Then, DNA is given by:

$$DNA=([AE+BE+CE+DE]/4-KNA) \tag{5}$$

where [AE+BE+CE+DE]/4 is the average of the inter-centroid distances AE, BE, CE, and DE.

Let tilt-X be a function describing rotation about the y-axis, tilt-Y be a function describing rotation about the x-axis, and Sx and Sy be the sensitivities. Then, tilt-X and tilt-Y are given by:

$$\text{tilt-}X=Sx(BE-DE)$$

$$\text{tilt-}Y=Sx(AE-CE) \tag{6}$$

The sensitivities Sx and Sy are of tilt-X and tilt-Y to (BE−DE) and (AE−CE) and are constants which depend on the configuration of the measurement device 200.

Let θ be a function describing the rotation of the image sensor 250 with respect to the calibration pattern 320'. Then, θ is given by:

$$\theta=(\tan^{-1}[(yb-ye)/(xb-xe)]+\tan^{-1}[(-xa+xe)/(ya-ye)]+ \\ \tan^{-1}[(yd-ye)/(xd-xe)]+\tan^{-1}[(-yc+ye)/(xc-xe)])/4 \tag{7}$$

A controller 190 performs a process for measuring at least one of the defocus amount, tilt, and rotation of the image sensor 250 using the calibration pattern 320', periodically or according to a given plan.

When pieces of information such as the defocus amount, tilt, and rotation of the image sensor 250 are specified, the position at which the light beam enters each pixel of the image sensor 250 can be detected. In view of this, the controller 190 corrects the measurement results of the optical characteristics of an exposure apparatus 100 (more specifically, a measurement error attributed to at least one of the defocus amount (position), tilt, and rotation of the image sensor 250) based on at least one of the defocus amount (position), tilt, and rotation of the image sensor 250. Alternatively, the controller 190 may correct the measurement results based on at least one of the defocus amount, tilt, and rotation of the image sensor 250 when converting the image sensing result obtained by the image sensor 250 into a pupil distribution.

Figure 14:
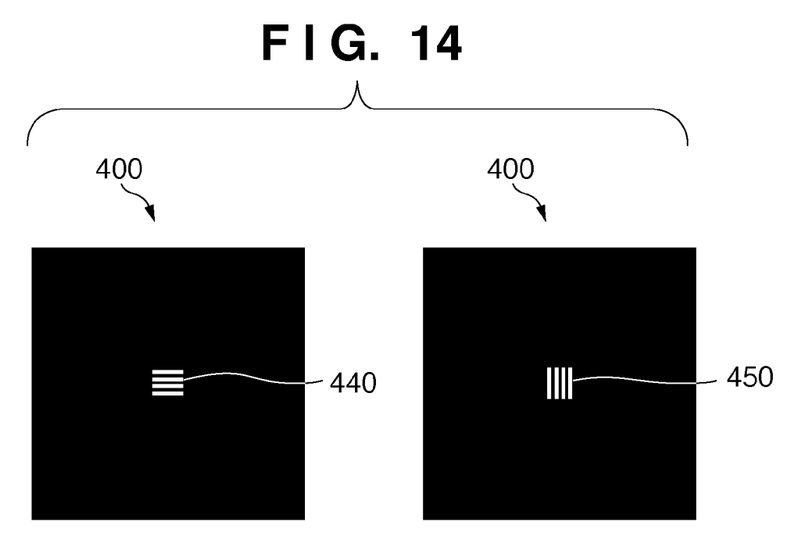
FIG. 14 is a view illustrating original-side calibration patterns for forming light beams which reach the image sensing plane of the image sensor at known incident angles in an exposure apparatus.

FIG. 14 is a view illustrating original-side calibration patterns for forming light beams which reach the image sensing plane of the image sensor 250 at known incident angles in the exposure apparatus. In the original-side pattern unit 400, a calibration pattern 440 is a diffraction grating having slits extending parallel to the x direction, and a calibration pattern 450 is a diffraction grating having slits extending parallel to the y direction. The incident angles of ±1st-order diffracted light beams can be detected by measuring the pitches of these diffraction gratings. The use of the original-side calibration patterns 440 and 450 allows measurement of the defocus amount and tilt of the image sensor 250 on the main body of the exposure apparatus.

Figure 15:
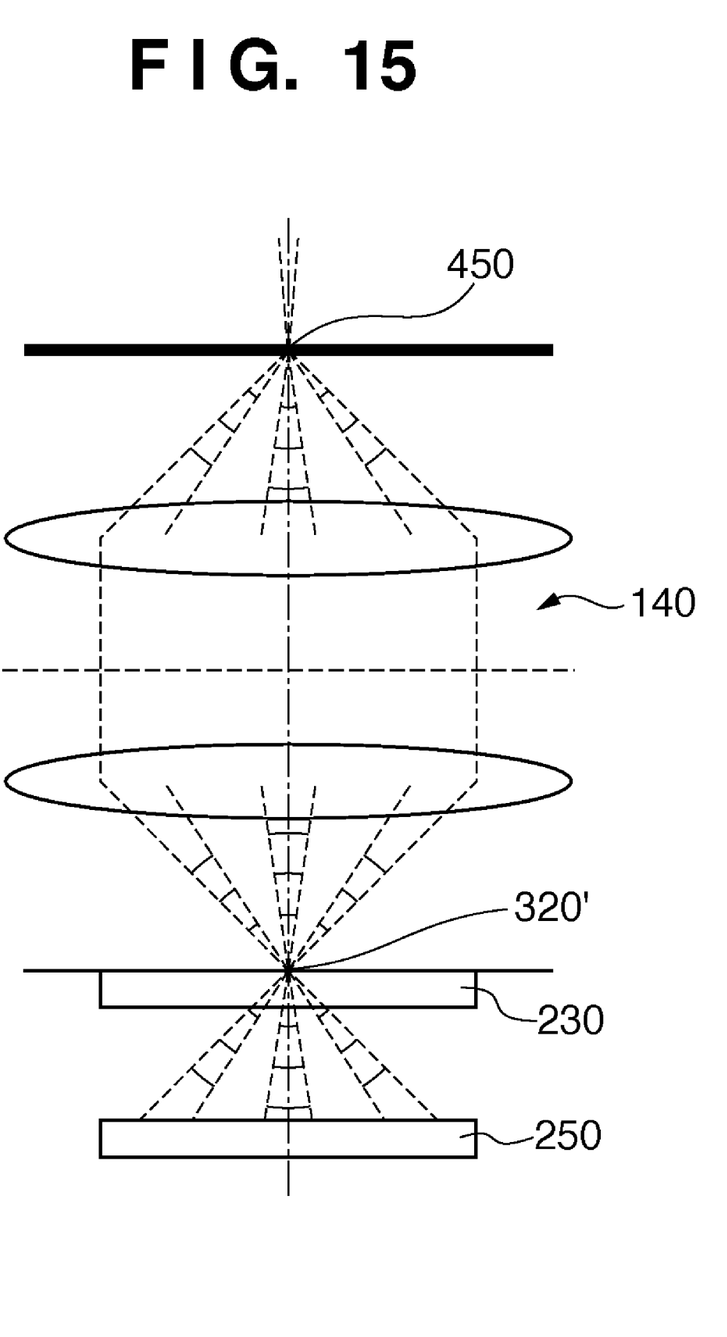
FIG. 15 is a view showing the arrangement in measuring the defocus amount and tilt of the image sensor of a measurement device.

FIG. 15 is a view showing the arrangement in measuring the defocus amount and tilt of the image sensor 250 of the measurement device 200. An illumination system 110 illuminates the original-side calibration pattern 450. Since the original-side calibration pattern 450 is a diffraction grating, it generates a 0th-order light beam and ±1st-order diffracted light beams. In one embodiment, the pitch of the original-side calibration pattern 450 is determined such that ±1st-order diffracted light beams diverge into the pupil of a projection optical system 140. The 0th-order light beam and ±1st-order diffracted light beams are sensed by the image sensor 250 upon passing through a substrate-side measurement pattern 310. Diffracted light beams can be diverged in the X and Y directions with respect to a substrate stage 150 by changing the original-side pattern used to the calibration pattern 440 and performing the measurement. This makes it possible to obtain a pupil distribution 700 as shown in FIG. 13.

It is noted that the measurement device 200 may include a calibration pattern 320', the image sensor 250 and the glass substrate 230. The image sensing plane of the image sensor 250 is illuminated via the calibration pattern 320'.

Although diffracted light beams are generated in the X and Y directions in this example, they may be generated in the 45° and 135° directions. It is also possible to calculate the defocus amount and tilt of the image sensor 250 by exploiting the results obtained using both the former and latter diffracted light beams. A drawing error component of the calibration pattern may be corrected by averaging the measurement results obtained when the calibration pattern is rotated through 180° and when the calibration pattern remains without rotation. Also, a prism or the like may be used in place of a diffraction grating in order to form a light beam which emerges from the calibration pattern at a known exit angle and strikes the image sensor at a known incident angle.

An original on which the original-side calibration patterns 440 and 450 are formed can be used for calibration as a single reference original. A single reference original can be commonly used in a plurality of exposure apparatuses, and can therefore suppress the individual differences among more than one measurement device 200. It is also possible to monitor a temporal change in optical characteristic of the exposure apparatus 100 with high accuracy by calibrating the defocus amount and tilt of the image sensor 250 periodically or according to a given plan.

As described above, in the third embodiment, the optical characteristics of the exposure apparatus can be measured with high accuracy by measuring the defocus amount and tilt of the image sensor 250 on the main body of the exposure apparatus. It is also possible to compensate for the individual differences among the measurement devices 200 of more than one exposure apparatus by adjusting the measurement devices 200 with respect to one reference. It is still also possible to monitor a temporal change in optical characteristic of the exposure apparatus with high accuracy by adjusting the measurement device 200 periodically or according to a given plan.

A device manufacturing method according to an embodiment of the present invention can be used to manufacture devices such as a semiconductor device and a liquid crystal device. The method can include a step of exposing a substrate coated with a photosensitive agent using an exposure apparatus, and a step of developing the exposed substrate. The device manufacturing method can also include known subsequent steps (e.g., oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-280268, filed Oct. 30, 2008, which is hereby incorporated by reference herein in its entirety.

What is claimed is:

1. An apparatus including an optical system for illuminating an original to project a pattern of the original onto a substrate, the apparatus comprising:
   a measurement device which includes a measurement pattern arranged on a substrate-side pattern unit and an image sensor arranged on a substrate stage that holds the substrate, and is configured to measure a characteristic of the optical system based on a light intensity distribution that is formed on an image sensing plane of the image sensor via the optical system and the measurement pattern, the substrate-side pattern unit being on a side of the substrate stage;
   a calibration pattern arranged on the substrate-side pattern unit; and
   a controller configured to correct the light intensity distribution formed by the measurement pattern and captured by the image sensor, based on a light intensity distribution formed by the calibration pattern and captured by the image sensor, and a light intensity distribution that is calculated based on data for the calibration pattern as a light intensity distribution to be formed by the calibration pattern,
   wherein the calibration pattern is arranged to surround a region where the measurement pattern is arranged.

2. The apparatus according to claim 1, further comprising:
   an original-side measurement pattern configured to illuminate the measurement pattern; and
   an original-side calibration pattern configured to illuminate the calibration pattern.

3. The apparatus according to claim 2,
   wherein the original-side measurement pattern and the original-side calibration pattern are used selectively.

4. The apparatus according to claim 1, wherein
the calibration pattern forms the light intensity distribution upon being illuminated in order to calibrate the measurement device, and
the measurement pattern forms the light intensity distribution which bears information representing the characteristic of the optical system upon being illuminated in order to measure the characteristic of the optical system.

5. The apparatus according to claim 1, wherein the calibration pattern includes a plurality of optical elements, and a plurality of light intensity distributions formed on the image sensing plane by the plurality of optical elements are synthesized on the image sensing plane.

6. The apparatus according to claim 5, wherein the optical element is one of a pinhole, a slit, a diffusing member, and a diffractive element.

7. The apparatus according to claim 1, wherein the controller calibrates characteristics of sensitivity of respective pixels of the image sensor based on a ratio between a light intensity in the light intensity distribution by the calibration pattern and captured by the image sensor, and a light intensity in the theoretical light intensity distribution that is expected to be formed on the image sensing plane by the calibration pattern.

8. The apparatus according to claim 1, wherein the substrate-side pattern unit is arranged on the substrate stage.

9. The apparatus according to claim 1, further comprising an original stage configured to hold the original, wherein
the original stage includes an original-side measurement pattern configured to illuminate the measurement pattern, and an original-side calibration pattern configured to illuminate the calibration pattern.

10. The apparatus according to claim 9, wherein
the original-side measurement pattern and the original-side calibration pattern are selectively used by driving the original stage.

11. The apparatus according to claim 1, wherein the controller calibrates the measurement device periodically or according to a given plan.

12. A method comprising:
exposing a substrate using an apparatus; and
developing the exposed substrate,
wherein the apparatus comprises:
an optical system for illuminating an original to project a pattern of the original onto the substrate;
a measurement device which includes a measurement pattern arranged on a substrate-side pattern unit and an image sensor arranged on a substrate stage that holds the substrate, and is configured to measure a characteristic of the optical system based on a light intensity distribution that is formed on an image sensing plane of the image sensor via the optical system and the measurement pattern, the substrate-side pattern unit being on a side of the substrate stage;
a calibration pattern arranged on the substrate-side pattern unit; and
a controller configured to correct the light intensity distribution formed by the measurement pattern and captured by the image sensor, based on a light intensity distribution that is formed by the calibration pattern and captured by the image sensor, and a light intensity distribution that is to be formed on the image sensing plane calculated based on data for the calibration pattern as a light intensity distribution to be formed by the calibration pattern,
wherein the calibration pattern is arranged to surround a region where the measurement pattern is arranged.

13. An apparatus comprising:
a measurement device including a measurement pattern arranged on a substrate-side pattern unit and an image sensor arranged on a substrate stage that holds a substrate, configured to measure a characteristic of an optical system based on a light intensity distribution that is formed on an image sensing plane of the image sensor via the optical system and the measurement pattern, the substrate-side pattern unit being on a side of the substrate stage;
a calibration pattern arranged on a substrate-side pattern unit; and
a controller configured to correct the light intensity distribution formed by the measurement pattern and captured by the image sensor, based on a light intensity distribution formed by the calibration pattern and captured by the image sensor, and a light intensity distribution that is calculated based on data for the calibration pattern as a light intensity distribution to be formed.

14. The apparatus according to claim 13, wherein the calibration pattern is arranged around a region where the measurement pattern is arranged.

15. The apparatus according to claim 14, further comprising:
an original-side measurement pattern configured to illuminate the measurement pattern; and
an original-side calibration pattern configured to illuminate the calibration pattern.

16. The apparatus according to claim 15, wherein the original-side measurement pattern and the original-side calibration pattern are used selectively.

17. The apparatus according to claim 14, wherein the calibration pattern forms the light intensity distribution upon being illuminated in order to calibrate the measurement device, and the measurement pattern forms the light intensity distribution which bears information representing the characteristic of the optical system upon being illuminated in order to measure the characteristic of the optical system.

* * * * *